(12) United States Patent
Li et al.

(10) Patent No.: US 8,604,564 B2
(45) Date of Patent: Dec. 10, 2013

(54) SEMICONDUCTOR STRUCTURES AND METHODS OF MANUFACTURING THE SAME

(75) Inventors: Xi Li, Hopewell Junction, NY (US); Viorel C. Ontalus, Hopewell Junction, NY (US)

(73) Assignee: International Business Machine Corporation, Armonk, NY (US)

( * ) Notice: Subject to any disclaimer, the term of this patent is extended or adjusted under 35 U.S.C. 154(b) by 0 days.

(21) Appl. No.: 13/422,390

(22) Filed: Mar. 16, 2012

(65) Prior Publication Data

US 2012/0175713 A1 Jul. 12, 2012

Related U.S. Application Data

(62) Division of application No. 12/700,059, filed on Feb. 4, 2010, now Pat. No. 8,278,164.

(51) Int. Cl.
*H01L 29/78* (2006.01)

(52) U.S. Cl.
USPC ............ 257/408; 257/E21.214; 257/E21.409; 257/E29.266; 438/197; 438/50; 438/285; 438/262

(58) Field of Classification Search
USPC .................... 438/50, 285, 694, 197
See application file for complete search history.

(56) References Cited

U.S. PATENT DOCUMENTS

| | | | |
|---|---|---|---|
| 6,657,261 B2 * | 12/2003 | Assaderaghi et al. ........ 257/354 |
| 6,924,543 B2 | 8/2005 | Tolchinsky et al. | |
| 7,279,406 B2 | 10/2007 | Koontz | |
| 7,396,714 B2 | 7/2008 | Chen et al. | |
| 7,399,663 B2 | 7/2008 | Hoentschel et al. | |
| 7,402,872 B2 | 7/2008 | Murthy et al. | |
| 7,429,775 B1 | 9/2008 | Nayak et al. | |
| 7,446,026 B2 | 11/2008 | Zhang et al. | |
| 7,514,309 B2 | 4/2009 | Sridhar et al. | |
| 7,557,010 B2 | 7/2009 | Chen et al. | |
| 7,560,758 B2 | 7/2009 | Zhu et al. | |
| 7,579,248 B2 | 8/2009 | Huang et al. | |
| 2005/0148147 A1 * | 7/2005 | Keating et al. ................ 438/299 |
| 2006/0076627 A1 * | 4/2006 | Chen et al. .................... 257/369 |
| 2007/0018205 A1 | 1/2007 | Chidambarrao et al. | |
| 2007/0054457 A1 | 3/2007 | Ueno et al. | |
| 2008/0233691 A1 | 9/2008 | Cheng et al. | |
| 2008/0237634 A1 | 10/2008 | Dyer et al. | |
| 2008/0251817 A1 | 10/2008 | Chidambarrao et al. | |
| 2008/0299724 A1 | 12/2008 | Grudowski et al. | |
| 2009/0020783 A1 | 1/2009 | Zhang et al. | |
| 2009/0075029 A1 | 3/2009 | Thomas et al. | |
| 2009/0174005 A1 | 7/2009 | Pacheco Rotondaro et al. | |
| 2009/0242989 A1 | 10/2009 | Chan et al. | |
| 2009/0302348 A1 | 12/2009 | Adam et al. | |
| 2010/0187578 A1 | 7/2010 | Faltermeier et al. | |
| 2010/0258868 A1 | 10/2010 | Yin et al. | |

* cited by examiner

*Primary Examiner* — Mamadou Diallo
(74) *Attorney, Agent, or Firm* — Mathew Zehrer; Roberts Mlotkowski Safran & Cole, P.C.

(57) ABSTRACT

A semiconductor structure has embedded stressor material for enhanced transistor performance. The method of forming the semiconductor structure includes etching an undercut in a substrate material under one or more gate structures while protecting an implant with a liner material. The method further includes removing the liner material on a side of the implant and depositing stressor material in the undercut under the one or more gate structures.

18 Claims, 6 Drawing Sheets

SEMICONDUCTOR STRUCTURES AND METHODS OF MANUFACTURING THE SAME

CROSS REFERENCE TO RELATED APPLICATIONS

The present application is a divisional application of co-pending U.S. application Ser. No. 12/700,059, filed on Feb. 4, 2010, the contents of which are incorporated by reference in its entirety herein.

FIELD OF THE INVENTION

The invention relates to semiconductor structures and methods of manufacture, and more particularly, to semiconductor structures having embedded stressor material for enhanced transistor performance and methods of manufacture.

BACKGROUND

To improve the current flowing through the channel of a transistor, the mobility of the carriers in the channel can be increased. This increased mobility of the carriers in the channel typically increases the operational speed of the transistor. It is further known that mechanical stresses within a semiconductor device substrate can modulate device performance by, for example, increasing the mobility of the carriers in the semiconductor device. That is, stresses within a semiconductor device are known to enhance semiconductor device characteristics. Thus, to improve the characteristics of a semiconductor device, tensile and/or compressive stresses are created in the channel of the n-type devices (e.g., NFETs) and/or p-type devices (e.g., PFETs).

However, the same strain component, for example, tensile strain or compressive strain in a certain direction, may improve the device characteristics of one type of device (i.e., n-type device or p-type device) while discriminatively affecting the characteristics of the other type device. Accordingly, in order to maximize the performance of both NFETs and PFETs within integrated circuit (IC) devices, the strain components should be engineered and applied differently for NFETs and PFETs.

Distinctive processes and different combinations of materials are used to selectively create a strain in a FET. For example, liners of different materials on gate sidewalls have been used to selectively induce the appropriate strain in the channels of the FET devices. By providing gate liners the appropriate strain is applied closer to the device. While this method does provide tensile strains to the NFET device and compressive strains along the longitudinal direction of the PFET device, using different materials, they may require additional materials and/or more complex processing, and thus, result in higher cost. Further, the level of strain that can be applied in these situations is typically moderate (i.e., on the order of 100s of MPa), and it is difficult to optimize the stress levels needed for high performance devices. Thus, it is desired to provide more cost-effective and simplified methods for creating larger tensile and compressive strains in the channels of the NFETs and PFETs, respectively.

Accordingly, there exists a need in the art to overcome the deficiencies and limitations described hereinabove.

SUMMARY

In first aspect of the invention, a method comprises etching an undercut in a substrate material under one or more gate structures while protecting an implant with a liner material. The method further includes removing the liner material on a side of the implant and depositing stressor material in the undercut under the one or more gate structures.

In another aspect of the invention, a method comprises forming gate structures on a substrate. The method comprises forming source/drain extension implants in the substrate and under the gate structures. The method comprises forming spacers on the gate structures. The method comprises forming recesses in the substrate and on the sides of the gate structures. The method comprises forming a liner on sidewalls of the recesses, which protect the extension implants during subsequent processes. The method comprises etching an undercut in the substrate to underneath the gate structures. The method comprises removing the liner on the sidewalls of the recesses. The method comprises depositing stressor material in the recesses and the undercut.

In yet another aspect of the invention, a structure comprises at least one gate structure formed on a substrate and sidewall spacers on sides of each of the least one gate structure. The structure further comprises extension implants under each of the at least one gate structure and recesses and undercuts in the substrate which are filled with stressor material. The recesses are on sides of each of the at least one gate structure and the undercuts are under each of the at least one gate structure and under the extension implants.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture, and more particularly, to semiconductor structures having embedded stressor material for enhanced transistor performance and methods of manufacture. In implementation, the present invention provides a process to integrate a stressor material into an undercut and recess formed in a substrate. Advantageously, the undercut can be optimized for particular stress concentrations of the device and, hence, provide improved manufacturing control and thus enhanced device performance.

In embodiments, the device can be, for example, a PFET or NFET, which has enhanced performance characteristics. In embodiments, the enhanced characteristics can be controlled and/or optimized by using epitaxial stressor material embedded in the undercut and/or recess such as, for example, $Si_{1-x}Ge_x$ for a PFET and $Si_{1-x}C_x$ for an NFET, where the epitaxial stressors can be in-situ doped or intrinsic. The method of the present invention also provides improved control of device performance by optimizing the amount of stressor material used for the device. As an example, the present invention can maximize the amount of stressor material placed in the undercut and/or recess to maximize the channel stress for both the NFET and PFET.

Figure 1:
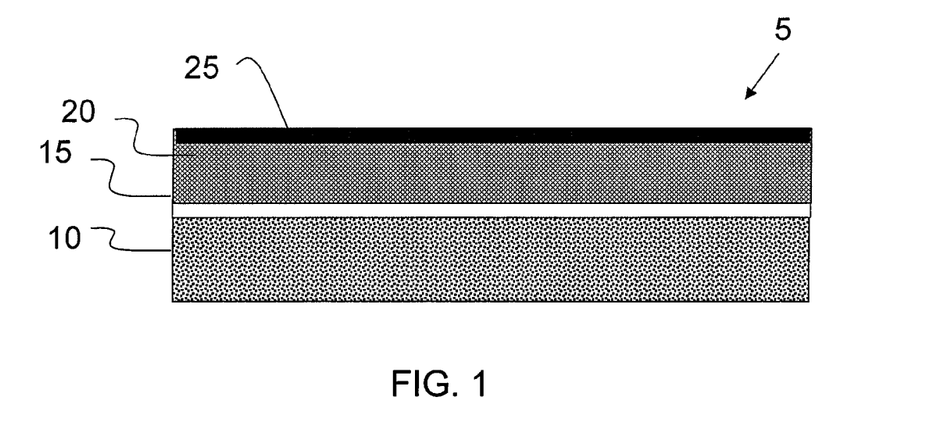
FIG. 1 shows a beginning structure and respective processing steps in accordance with aspects of the invention.

FIG. 1 shows a beginning structure in accordance with aspects of the invention. The beginning structure 5 includes a substrate 10 such as, for example, SOI or Buried Oxide. It should be understood that the substrate 10 can be other materials known to those of skill it the art. A gate insulator layer 15 is deposited or grown on the substrate 10. The gate insulator layer 15 can be, for example, oxide or high-k material such as, for example, an oxynitride, silicon oxynitride, Hf or a combination of these materials in a stacked structure. The gate insulator layer 15 can range in thickness depending on the material, combination of materials and/or technology node. For example, the gate insulator layer 15 can range from about 10 Å to about 55 Å; although other dimensions are contemplated by the present invention.

Still referring to FIG. 1, a gate material 20 is formed on the gate insulator layer 15. The gate material 20 can be, for example, a poly gate or high-k material. In further embodiments, the gate material 20 can be a metal or metal alloy. An optional cap material 25 can be deposited or grown on the gate material 20. The cap material 25 can be, for example, an oxide or nitride material.

Figure 2:
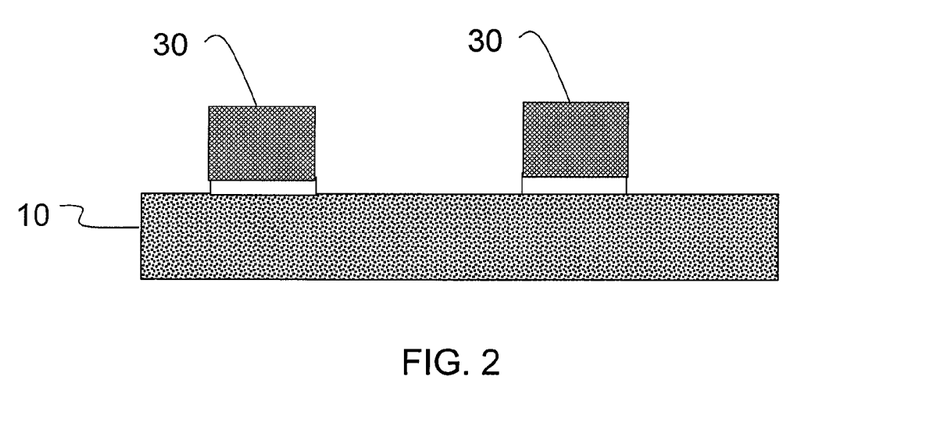
FIGS. 2-8 show additional structures and respective processing steps in accordance with aspects of the invention.

In FIG. 2, the gate insulator layer 15 and gate material 20 undergo an etching process such as, for example, a reactive ion etching (RIE), to form gate structures 30. The etching process will stop at the substrate 10. In the case of using the optional cap material 25, such layer will also undergo the etching process.

Figure 3:
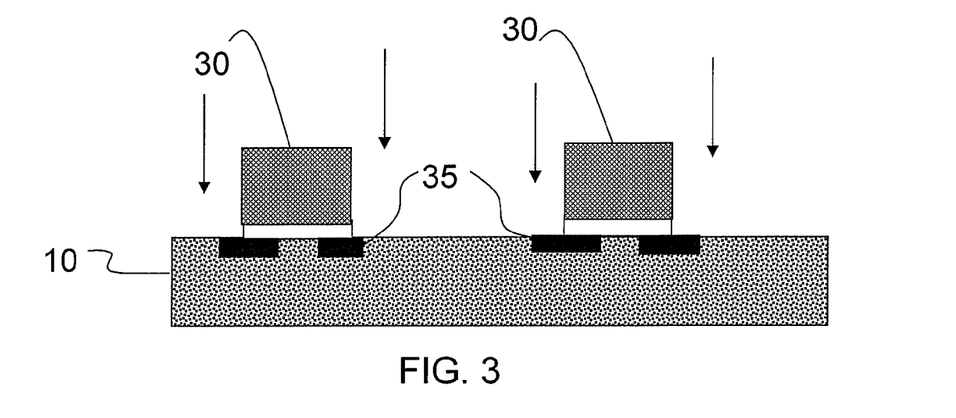

In FIG. 3, the structure undergoes implantation and annealing processes. More specifically, the structure undergoes an extension implant and annealing process to form extension implants 35. In embodiments, the implant dopant can be Boron for a P-type device, or Arsenic or Phosphorous for an N-type device. After the implant, the structure undergoes an annealing process. In embodiments, the annealing process is at a temperature of about between 800° C. to 1080° C. in order to activate the implant dopant. The annealing process forms the extension implants 35, preferably under the gate structure 30.

Figure 4:
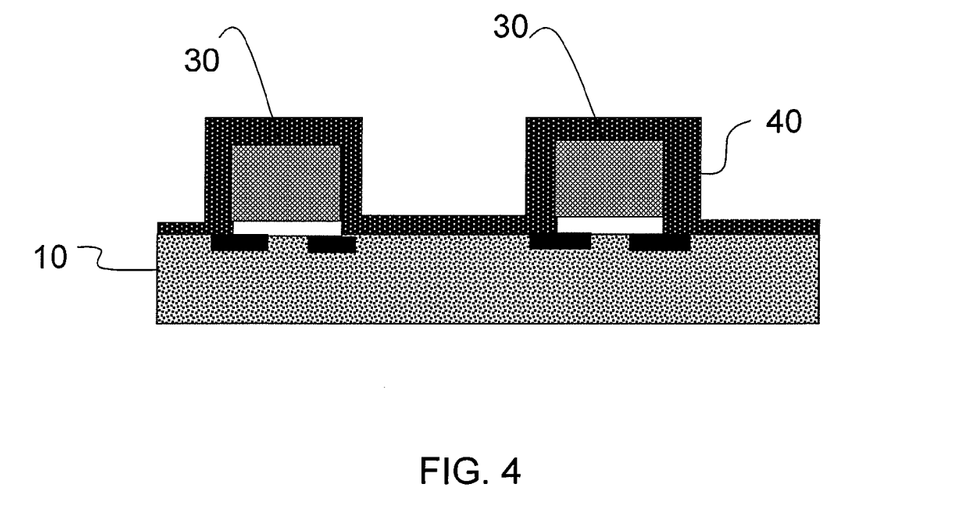

In FIG. 4, a material 40 is deposited over the gate structure 30 and exposed portions of the substrate 10 to form a spacer on the sidewalls of the gate structure 30. In embodiments, the material 40 can be a nitride material. In further embodiments, the material 40 can be oxide or other insulator material. The material 40 can be formed using any conventional deposition process such as, for example, PECVD, LECVD, CVD, MLD or ALD processes.

Figure 5:
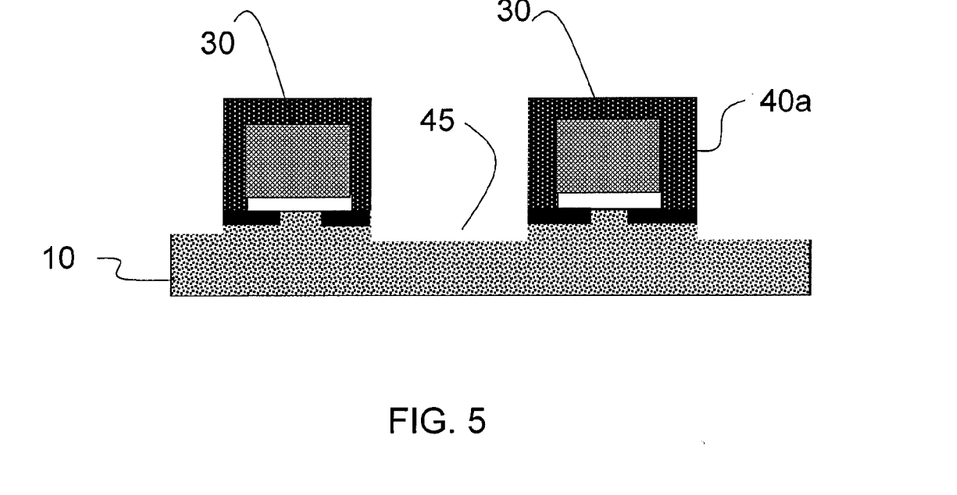

FIG. 5 shows additional processing steps in accordance with the invention. In particular, FIG. 5 shows the formation of a spacer 40a and a recess 45. To form the spacer 40a, the material 40 deposited on the substrate 10 is removed (etched away) using conventional etchants selective to the underlying substrate 10. This etching process is an anisotropic etching process. The remaining material will form the spacer 40a.

Thereafter, the structure undergoes a second etching process selective to the spacer 40a, which is also an anisotropic silicon etching process. In this etching process, recesses 45 are formed in the substrate 10, on sides of the gate structures 30. It should be understood that this etching process will also form recesses 45 between adjacent gate structures 30. In embodiments, the recesses 45 can range in depth from about 1 nm to about 30 nm, depending on the ground rules associated with technology node, the desired transistor electrostatic configuration and amount of stress to be placed on the gate structures 30. It should also be understood by those of skill in the art that other dimensions for the recesses 45 are contemplated by the present invention, depending on the technology node, dimensions of the underlying substrate 10, etc.

Figure 6:
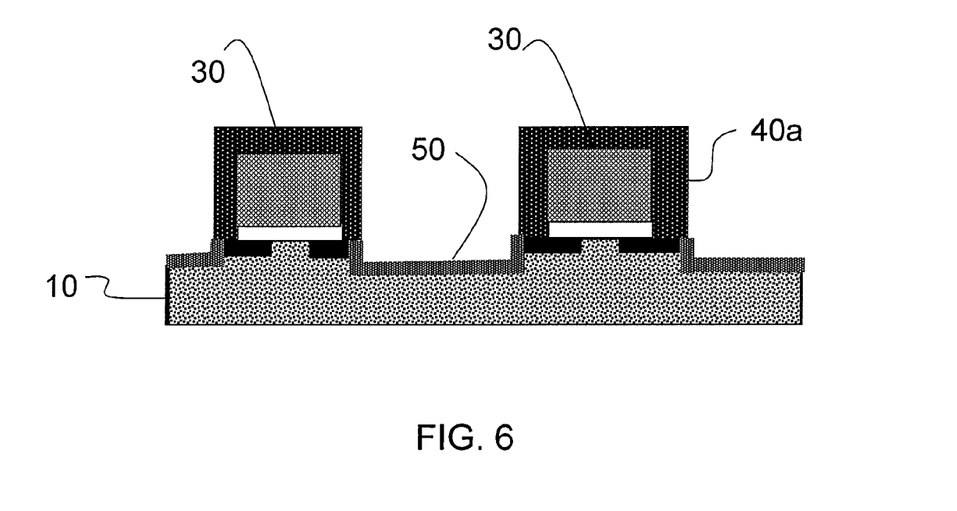

In FIG. 6, a liner 50 is formed on the sidewalls and the bottom of the recesses 45. In contemplated embodiments, the liner 50 can be either the same or different material than that used to form the spacer 40a. For example, the liner and spacer 40a can be an oxide material, with the liner 50 formed by an oxidation or deposition process. In alternative embodiments, the liner 50 and spacer 40a can be a nitride material, with the liner 50 formed by a deposition process. Alternatively, the liner 50 can be an oxide material and the spacer 40a can be a nitride material, or vice versa. It is noted, though, that subsequent processing steps are affected by the materials used for the liner 50 and spacer 40a. For example, by using different materials for the liner 50 and spacer 40a a selective RIE to the, e.g., spacer material 40, can be used to etch the liner 50. In such a selective RIE, a block mask would not be needed to protect the spacer 40a. Alternatively, using the same materials for the liner 50 and spacer 40a, a block mask would be required to protect the spacer material 40 during a liner etch.

Figure 7:
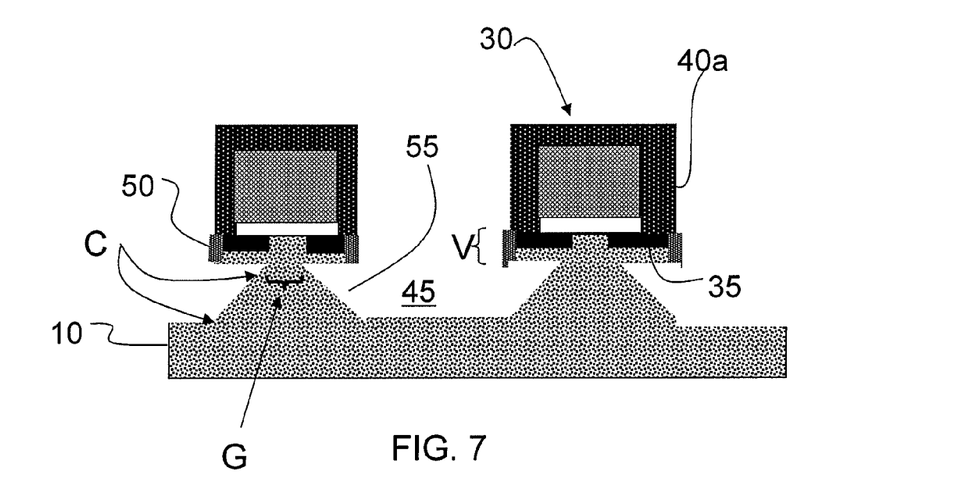

FIG. 7 represents two etching processes in accordance with aspects of the invention. In a first etching process, the structure of FIG. 7 undergoes an anisotropic RIE process to remove the liner material on the bottom of the recess 45. This etching step can also deepen the recess 45. The structure then undergoes an isotropic reactive ion etching (RIB) or a wet etch to provide undercuts 55 under the gate structures 30. In embodiments, the wet etchant can be, for example, ammonia, which will result in sharp corners "C", as shown in FIG. 7, or rounded shapes as in FIG. 9 after isotropic etch.

In embodiments, the liner 50 will protect the extension implants 35 during the isotropic RIE process. This, advantageously, will ensure that the threshold voltage control, Vt, provided by the extension implants 35 remains constant (i.e., is unaffected by the etching process). Additionally, the liner 50 can control the vertical space "V" between the undercut 55 and the extension implants 35, providing added optimization of the stress component. For example, the vertical space "V" will control the distance between a stressor material (to be placed in the undercut) and the gate structure 30. As this distance can be variable, the stress component acting on the gate structure 30 can vary, e.g., be a weak, moderate or strong stress component.

Also, it is possible to vary the time of the second RIE process in order to optimize the stress component. For example, a longer etch time will result in a deeper recess and undercut and, hence, less substrate material, e.g., Si, between the undercuts and the gate structure 30, as compared to a shorter etch time. Also, the longer etch time will close the gap "G" under the gate structure 30, resulting in less space between the stressor material on both sides of the gate structure and, effectively, increasing the amount of stressor material required to fill in the recess 45 and undercut 55. Accordingly, the longer etch time will thus result in more stressor material being placed in the undercuts 55, under the gate structure 30.

Figure 8:
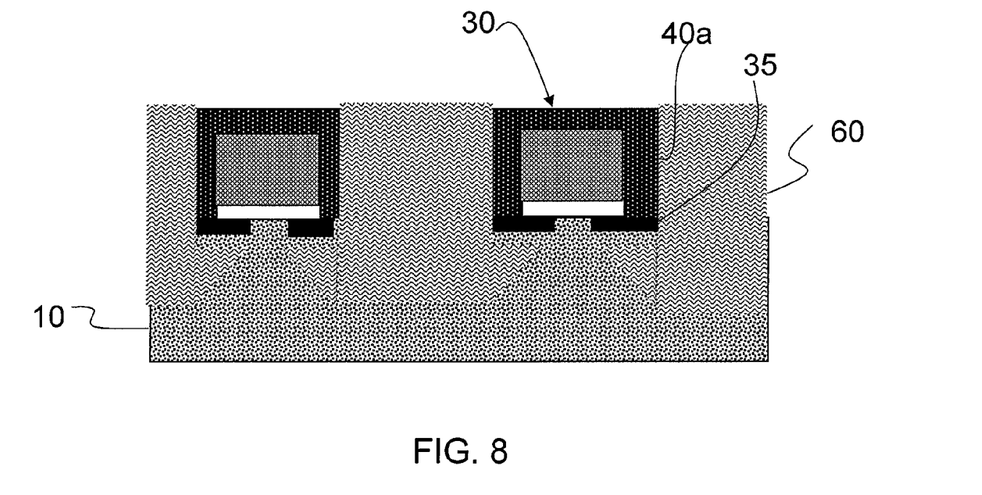

FIG. 8 shows a structure and respective processing steps in accordance with the invention. In FIG. 8, the liner 50 is removed using, for example, an isotropic etching process. The removal of the liner 50 will not affect the performance characteristics of the extension implants 35. Stressor material 60 is placed (deposited) in the recesses 45 and undercuts 55 using a conventional deposition process. In embodiments, the stressor material 60 can be, for example, $Si_{1-x}Ge_x$ for a PFET and $Si_{1-x}C_x$ for an NFET. The resultant structure thus provides improved control of the device performance by optimizing the stressor material under the gate structures 30. The resultant method can also maximize the amount of stressor material in the recess and undercuts in order to maximize the channel stress for both an NFET and PFET.

Figure 9:
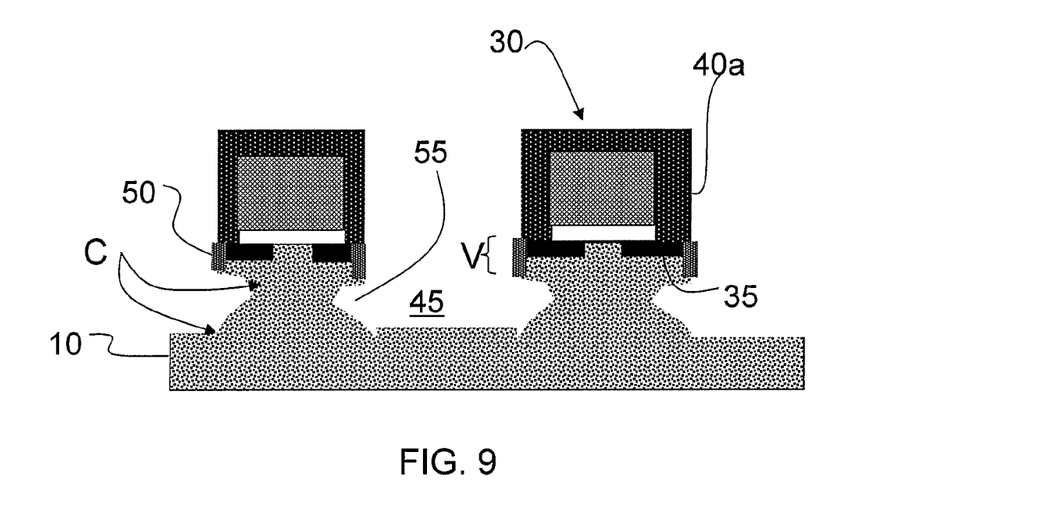
FIGS. 9 and 10 show an alternative structure and respective processing steps in accordance with aspects of the invention.
Figure 10:
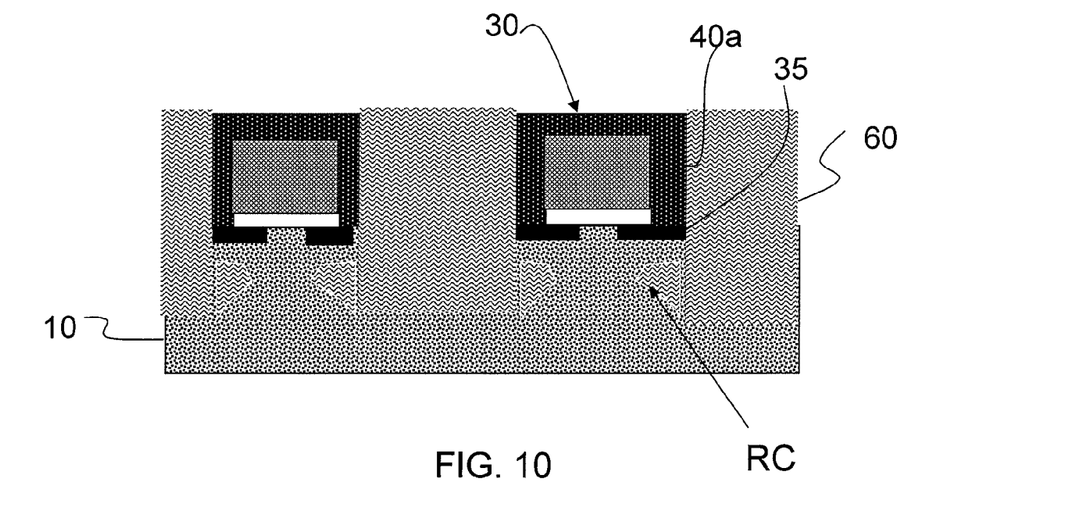

FIGS. 9 and 10 show an alternative structure and processing steps in accordance with the invention. In FIG. 9, etching and deposition processes are performed in accordance with aspects of the invention, beginning with the structure of FIG. 6. In a first etching process, the structure undergoes an anisotropic RIE process to remove the liner material on the bottom of the recess(es). This etching step can also deepen the recess(es). The structure then undergoes an isotropic RIE process to provide undercuts under the gate structures. In embodiments, the isotropic RIE results in rounded corners "RC", as shown in FIG. 9.

In FIG. 10, the liner 50 is removed using, for example, an isotropic etching process. The removal of the liner 50 will not affect the performance characteristics of the extension implants 35. Stressor material 60 is placed (deposited) in the recesses 45 and undercuts 55 using a conventional deposition process. In embodiments, the stressor material 60 can be, for example, $Si_{1-x}Ge_X$ for a PFET and $Si_{1-x}C_X$ for an NFET. The resultant structure thus provides improved control of the device performance by optimizing the stressor material under the gate structures 30. The resultant method can also maximize the amount of stressor material in the recess and undercuts in order to maximize the channel stress for both an NFET and PFET.

As in the previous embodiment, the liner will protect the extension implants during the isotropic RIE process. Additionally, the liner can control the vertical space between the undercut and the extension implants, providing added optimization of the stress component. Also, it is possible to vary the time of the RIE process in order to optimize the stress component. The liner is removed using, for example, an isotropic etching process. Stressor material 60 is placed (deposited) in the recess(es) and undercuts using a conventional deposition process. In embodiments, the stressor material 60 can be, for example, $Si_{1-x}Ge_X$ for a PFET and $Si_{1-x}C_X$ for an NFET.

Design Structure

Figure 11:
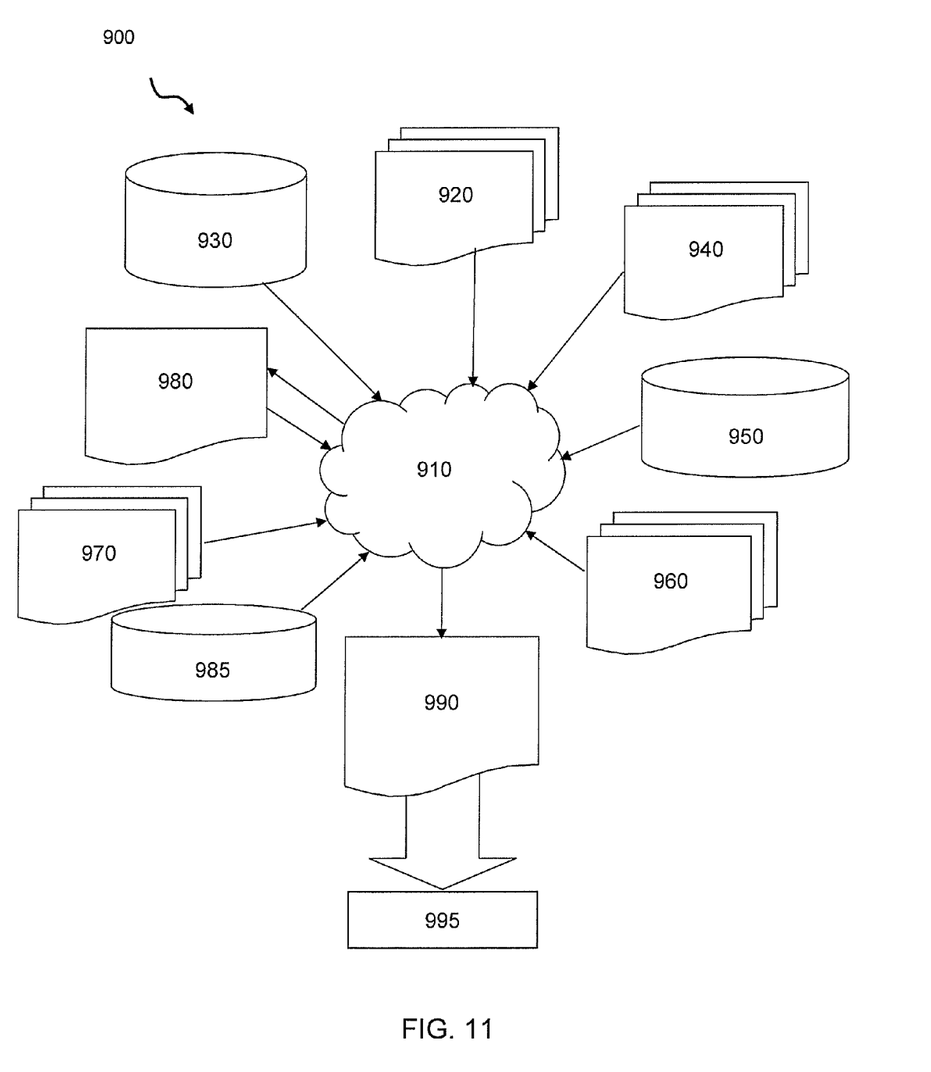
FIG. 11 is a flow diagram of a design process used in semiconductor design, manufacture, and/or test.

FIG. 11 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Alter® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-10 in the form of schematics or HDL, a hardware-description language (e.g., Virology, VHDL, C, etc.). Design structure 920 may be contained on one or more machine-readable media. For example, design structure 920 may be a text file or a graphical representation of an embodiment of the invention as shown in FIGS. 1-10. Design process 910 preferably synthesizes (or translates) embodiments of the invention as shown in FIGS. FIGS. 1-10 into a net list 980, where net list 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which net list 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-10, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A structure comprising:
   at least one gate structure formed on a substrate;
   sidewall spacers on sides of each of the at least one gate structure;
   extension implants under an insulator material of each of the at least one gate structure; and
   recesses and undercuts in the substrate which are filled with stressor material, wherein:
   the recesses are on sides of each of the at least one gate structure and the undercuts are under each of the at least one gate structure and under the extension implants; and
   the stressor material is separated from the extension implants by portions of the substrate.

2. The structure of claim 1, wherein the extension implants are under the sidewall spacers on sides of each of the at least one gate structure.

3. The structure of claim 1, further comprising a material deposited on a top and sidewalls of the gate structure.

4. The structure of claim 3, wherein the sidewall spacers are formed from the material deposited on the gate structure.

5. A structure comprising:
   gate structures on a substrate;
   extension implants in the substrate and under the gate structures;
   spacers on the gate structures;
   recesses in the substrate and on the sides of the gate structures;
   an undercut in the substrate to underneath the gate structures; and
   stressor material in the recesses and the undercut, wherein the stressor material is deposited in the undercut at a distance from the gate structure controlled by a vertical distance of a liner.

6. The structure claim 5, wherein the recesses are formed at a controllable depth.

7. The structure of claim 5, wherein the stressor material is $Si_{1-x}Ge_x$ for a PFET and $Si_{1-x}C_x$ for an NFET.

8. The structure of claim 5, wherein the extension implants are under an insulator material of the gate structures.

9. A structure comprising:
   an undercut in a substrate material under one or more gate structures; and
   stressor material in the undercut under the one or more gate structures and separated from an implant region by portions of a substrate layer.

10. The structure of claim 9, further comprising one or more recesses on sides of the one or more gate structures.

11. The structure of claim 10, wherein the one or more recesses has a depth ranging from about 1 nm to about 30 nm.

12. The structure of claim 9, further comprising a spacer material on sidewalls of the one or more gate structures.

13. The structure of claim 9, further comprising extension implants under the one or more gate structures.

14. The structure of claim 13, wherein:
    the stressor material is planar with material deposited on a top of the one or more gate structures; and
    the sidewall spacers are formed from the material.

15. A structure comprising:
    at least one gate structure formed on a substrate;
    sidewall spacers on sides of each of the at least one gate structure;
    extension implants under an insulator material of each of the at least one gate structure;
    recesses and undercuts in the substrate which are filled with stressor material; and
    a material deposited on a top and sidewalls of the gate structure, wherein:
    the recesses are on sides of each of the at least one gate structure and the undercuts are under each of the at least one gate structure and under the extension implants;
    the sidewall spacers are formed from the material deposited on the gate structure; and
    the stressor material is planar with the material deposited on the top of the gate structure.

16. A structure comprising:
    gate structures on a substrate;
    extension implants in the substrate and under the gate structures;
    spacers on the gate structures;
    recesses in the substrate and on the sides of the gate structures;
    an undercut in the substrate to underneath the gate structures; and
    stressor material in the recesses and the undercut, wherein the extension implants are under an insulator material of the gate structures and the stressor material is separated from the extension implants by portions of the substrate.

17. The structure of claim 16, wherein the extension implants are under the spacers on sides the gate structures.

18. A structure comprising:
    gate structures on a substrate;
    extension implants in the substrate and under the gate structures;
    spacers on the gate structures;
    recesses in the substrate and on the sides of the gate structures;
    an undercut in the substrate to underneath the gate structures; and
    stressor material in the recesses and the undercut, wherein:
    the spacers formed on sides of the gate structures are formed from a same material deposited on a top of the gate structures; and
    the stressor material is planar with the material deposited on the top of the gate structures.

* * * * *